United States Patent [19]

Faist et al.

[11] Patent Number: 5,204,870
[45] Date of Patent: Apr. 20, 1993

[54] METHOD OF IMPLEMENTATION OF SURFACE-EMISSION SEMICONDUCTOR LASERS, AND LASERS OBTAINED BY THE METHOD

[75] Inventors: Jêrome Faist, Murray Hill, N.J.; Franz K. Reinhart, Chemin de Chandolin, Switzerland

[73] Assignee: Thomson-CSF, Puteaux, France

[21] Appl. No.: 806,208

[22] Filed: Dec. 13, 1991

[30] Foreign Application Priority Data

Dec. 28, 1990 [FR] France .................. 90 16432

[51] Int. Cl.$^5$ .................................. H01S 3/19
[52] U.S. Cl. ................................ 372/45; 372/46; 372/50
[58] Field of Search ............ 372/45, 46, 47, 50

[56] References Cited

U.S. PATENT DOCUMENTS

| | | | |
|---|---|---|---|
| 4,675,876 | 6/1987 | Svilans | 372/47 |
| 4,949,350 | 8/1990 | Jewell et al. | 372/45 |
| 4,949,351 | 8/1990 | Imanaka | 372/45 |
| 5,031,185 | 7/1991 | Murakami et al. | 372/46 |
| 5,031,187 | 7/1991 | Orenstein et al. | 372/50 |
| 5,034,958 | 7/1991 | Kwon et al. | 372/45 |
| 5,047,366 | 9/1991 | Murakami | 372/45 |

FOREIGN PATENT DOCUMENTS 0177617  4/1986  European Pat. Off. .

OTHER PUBLICATIONS

Patent Abstracts of Japan, vol. 11, No. 288 (E-542) Sep. 17, 1987 & JP-A-62 086 883 (Matsushita Electric Ind. Co. Ltd.).
Patent Abstracts of Japan, vol. 13, No. 348 (E-799) Aug. 4, 1989 & JP-A-1 108 789 (Sharp Corp.).
Patent Abstracts of Japan, vol. 13, No. 243 (E-768) Jun. 7, 1989 & JP-A-1 044 085 (Seiko Epson Corp.).
Hoi-Jun Yoo, et al., "Low Series Resistance Vertical-Cavity Front-Surface-Emitting Laser Diode," Applied Physics Letters, vol. 56, No. 20, May 14, 1990, pp. 1942-1944.
C. J. Chang-Hasnain, et al., "Surface Emitting Laser Arrays with Uniformly Separated Wavelengths," Electronics Letters, vol. 26, No. 13, Jun. 21, 1990, pp. 940-942.
J. L. Jewell, et al., "Surface-Emitting Microlasers for Photonic Switching and Interchip Connections," Optical Engineering, vol. 29, No. 3, Mar. 1990, pp. 210-214.

Primary Examiner—Georgia Y. Epps
Attorney, Agent, or Firm—Pollock, VandeSande & Priddy

[57] ABSTRACT

The invention relates to a method of implementation of surface-emission laser diodes with multiple quantum wells, including a single epitaxy step and a single step of implantation and diffusion of doping impurities. The transverse dimensions of the laser are determined by application of a mask on the active region before the implantation of said doping impurities around said active region, thus avoiding the conventional step of chemical etching with its detrimental effects on the expected lifetime of the finished laser. The construction of the laser of the invention allows to optimize separately the characteristics of optical confinement (along the axis of propagation of the laser light) and of confinement of the charge carriers in said active region (perpendicularly to said axis of propagation). The thicknesses of the layers of a first distributed Bragg mirror and of the layers of said active region (quantum wells and intermediate layers or superlattices) are chosen so as to optimize the gains (in each quantum well) and to minimize the losses (in particular in said mirror) so as to optimize the threshold current and the energy efficiency of the laser. The invention also relates to lasers implemented in accordance with said method. Such lasers are particularly well suited to the use as arrays of laser diodes, individually controlled or not.

15 Claims, 5 Drawing Sheets

METHOD OF IMPLEMENTATION OF SURFACE-EMISSION SEMICONDUCTOR LASERS, AND LASERS OBTAINED BY THE METHOD

BACKGROUND OF THE INVENTION

The present invention relates to the methods of implementation of surface-emission semiconductor lasers, and to the lasers thus implemented.

The method according to the present invention can be advantageously used for implementing several lasers on a single substrate, thus forming a laser array. According to a characteristic, these lasers can be individually controlled.

A semiconductor laser is essentially constituted by an active medium, or "lasing medium", of the crystalline type in which the light is emitted by radiative recombination of the electrons and holes. The active medium is placed in a resonant optical cavity formed by two reflecting mirrors of which at least one is partially transparent to allow a portion of the light emitted within the optical cavity to output from this cavity. Electrons and holes are introduced in the active medium by regions of the n type and of the p type which are disposed in contact with the active medium.

Several variants of semiconductor lasers are known from the prior art and use various active media, various mirrors, various p and n materials, various sizes and various geometries However, the basic principles are the same in every case.

The active medium can be based, for example, on gallium arsenide (GaAs), indium phosphide (InP), or other III-V compounds; or alternatively certain II-VI or IV-VI compounds could also be used as active medium although their technology is less mature.

The main point is that the active medium must have an electron energy forbidden band narrower than the forbidden band of the adjacent n and p materials which provide the electrons and the holes, respectively.

The mirrors may be made of (conductive) metal or of dielectric multilayers or of semiconductors. In some implementations, a mirror can also be used to supply current to the active medium.

The constraints of the approach chosen for implementing a semiconductor laser will have repercussions on cost and yield, on the reproducibility and reliability of the implemented lasers, and on the energy efficiency of the lasers, then on the current consumption, the thermal dissipation and the lifetime of the lasers.

In general, it is desired to fabricate a laser with a highest possible gain for a given current, or a lowest possible threshold current for a given gain. In this respect, the multiple quantum-well (MQW) laser exhibits definite advantages because the threshold current is reduced proportionally to the volume of the active region.

Roughly, one must inject about $10^7$ A/cm$^3$ of current in the active region to trigger laser action. For a layer of 0.1 micron, for example, the threshold current is on the order of $10^3$ A/cm$^2$. In a conventional laser with double heterostructure, the thickness of the epitaxial layers in the active region is of about one to a few hundreds of nanometers. In a MQW laser, the active layers have a thickness of a few nanometers and the density of the threshold current is decreased by about an order of magnitude.

However, to benefit from this advantage, it is necessary to implement a MQW laser with very low losses and consequently with very good mirrors. In addition, the crystalline structure of the active medium must be perfect: any mesh defect condemns the laser to premature failure.

This leads to the use of epitaxial or single-crystal growth methods such as, for example, those of metallo-organic chemical vapor deposition (MOCVD) or alternatively that of molecular-beam epitaxy (MBE) so as to control the thickness of the epitaxial layers to within an atomic layer while achieving a lattice mesh defect level as low as possible. Other growth methods can be envisaged but are not yet fully validated in industrial practice, such as chemical-beam epitaxy (CBE) and molecular-beam epitaxy of metallo-organic compounds (MOMBE).

On either side of the active medium, mirrors are placed so as to create a cavity in which the laser light is amplified. At least one of the two mirrors is semitransparent so that it is possible to extract a portion of the optical power from within the cavity toward outside for use.

For the MQW lasers with surface emission, very good mirrors are required to obtain losses as low as possible within the cavity.

The mirrors may be a metal directly deposited on the layers of the active region, or alternatively a dielectric, therefore insulating. In the present invention, a non-limitative preferred embodiment uses mirrors formed by a stack of various layers of dielectric to form a so-called "Bragg mirror". In a Bragg mirror, each layer of dielectric with a thickness of a few tenths of a micron only, is highly transparent. Stacking alternate layers of different compositions and index of refraction causes the reflection of light in the interfaces between these single-crystal layers obtained by epitaxial growth, due to the difference in refractive index. In the case of epitaxially grown heterostructures with a lattice incoherence between the compounds constituting the successive layers, the latter may be constructed as superlattices where the lattice incoherence is insufficient to cause the creation of defects in the interface of the layers of different compounds, provided the layers are sufficiently thin (a few atomic layers).

The emitted light is constituted by photons produced by the radiative recombination of the electron-hole pairs. The charge carriers—electrons and holes—are supplied to the active region by n and p materials located in the immediate vicinity and in physical contact with the active region. In order to obtain a maximum efficiency, the distance to be traveled before recombination for a hole as for an electron must be shorter than one carrier diffusion length, that is about one to a few microns. This parameter may be determining for the maximum size of the active region.

Also, in order to optimize the efficiency of the laser, it is necessary to minimize the losses due to non-radiative recombinations which take preferably place on the free surfaces of the active region.

Laser amplification by stimulated emission of radiation is obtained through the presence of the photons in the active region, which photons must be confined to the active region to obtain this amplifier action. The photons are confined by the mirrors in the direction of emission (perpendicular to the surface of the laser in the case of the present invention); photons with any other direction of propagation are not confined and consequently are not amplified. In other words, only the emission occuring in the desired direction is stimulated, thanks to the presence of a population of photons in the corresponding quantum state.

Sending back the photons in the active region by mirrors produces a feedback which reinforces the emission of identical photons and consequetly the amplification of light in the active region. This sending back of the photons can be obtained by means of mirrors which consist of several transparent layers with different refractive indices, the feedback being then a so-called "distributed feedback" and the mirrors are referred to as "distributed Bragg reflectors".

But sending back the photons can also be obtained by means of partial reflections between the layers within the active region itself. The laser is then called a "distributed-feedback laser".

To sum up, we have seen that, to implement a solid-state laser, for one thing, it is necessary to provide charge carriers (electrons and holes) to an active region where they will be confined until their radiative recombination and, for another thing, the resulting photons must be confined in the active region a sufficiently long time to obtain the stimulation of emission.

The first problem encountered in the implementation of surface-emission lasers is to confine the photons and the carriers in the active region, whereas the direction of current and that of light emission is the same in most cases.

A first approach known in the prior art from the French patent No. 88 16215, for example, is to have the current come from the sides of the active region so as to be able to optimize in an independent manner the optical and electrical designs as in conventional lasers with emission through the edges.

Other approaches are also known from the prior art, but each of them has disadvantages. The first arrays of laser diodes with surface emission have been implemented at Bell Laboratories, in Holmded, and at Bellcore, in Red Bank. To decrease the volume of the active region and consequently the threshold current, the lasers implemented in great numbers on a single substrate (up to 2 million lasers per square centimeter) are separated and their diameter defined by a deep anisotropic etching (up to 5 microns depth for lasers of 1 to 5 microns in diameter). The main problem of this method is that the lasers are in contact with air on the sides (they have the shape of a vertical cylinder with the axis parallel to the emission). Etching tends to deteriorate the lattice structure of the etched portion and leaves lattice defects on the edges of the active region.

Moreover, the non-radiative recombination is stronger on the free sides of the active region. Finally, for the integration into an array, possibly with individual control, it is desirable to fill the voids between the lasers, up to planarization. This could increase the cooling of the lasers, and also serve as a support for the control electrical traces; in addition, non-radiative recombinations should be reduced proportionally to the reduction of the free surface area.

In the prior art, two methods are known to fill the voids between the lasers. One method consists in a planarization carried out on the plate comprising the array of lasers by depositing a material by epitaxial growth methods, for example. Such a method turns out to be difficult to implement, for the depth to be filled is of about 5 microns, whereas the width of the voids between the lasers is often of about 1 to 2 microns only.

Another method known from the prior art consists in implementing the laser by the epitaxy methods mentioned above and then to create sources of holes and electrons on either side of the active region through diffusion of impurities ("dopants") p and n, respectively, in the material surrounding the active region.

This method is described in the French application for patent having the French number 88 16215 filed by the present applicant.

In accordance with this method, the p and n impurities are diffused, each respectively in a half-shell surrounding half of each laser diode. This method has the disadvantage of requiring several (at least two but possibly more) steps of implantation and diffusion of impurities in accordance with a precise and alternate geometry.

SUMMARY OF THE INVENTION

An object of the present invention is to remedy the disadvantages of the method of fabrication of surface-emission lasers of the prior art. More specifically, the method according to the present invention is intended to simplify the processing steps and to reduce their number, thus decreasing the fabrication cost while increasing the yield, and while ensuring a better performance of the lasers thus fabricated: gain, threshold current, electrical power consumption, reproducibility, reliability, durability, etc.

To these ends, the present invention proposes a method of fabrication of surface-emission laser diodes comprising mainly the steps of:

epitaxially growing on a single-crystal substrate a single-crystal Bragg mirror, the substrate and the mirror being n-doped;

epitaxially growing at least one single-crystal layer of a first compound with a forbidden band $E_2$;

possibly epitaxially growing a single-crystal layer of a second compound with a forbidden band $E_1 \leq E_2$;

epitaxially growing a single-crystal multilayer active medium having transverse dimensions greater than those of the active medium of the laser to be obtained; this growth may be designed to obtain a plurality of quantum wells, for example, or on the contrary, to obtain a superlattice of various compounds but with lattice coherence, or alternatively, it is possible to alternate the two structures;

epitaxially growing a single-crystal layer of a compound with a forbidden band $E_1 \leq E_2$;

possibly epitaxially growing a single-crystal layer of a first compound with a forbidden band $E_2$;

locally masking the surface of the last epitaxial layer to define the lateral dimensions of the active region;

implanting and/or diffusing p-type impurities in the region surrounding the active region, outside the region masked by the preceding step, to a depth reaching the first epitaxial layer with a forbidden band $E_2$;

depositing metal ohmic contacts on the last epitaxial layer and under the substrate;

depositing a semitransparent mirror over the active region, for example a dielectric multilayer mirror made up of alternate layers of $SiO_2$ and $TiO_2$.

The order of the steps is indicated for a non-limitative preferred embodiment, but does not exclude the implementation in a different order or with additional steps to the method of the present invention. Moreover, the first and the second epitaxial layer can be made of a single compound and, therefore, be a single layer.

The method according to the present invention thus allows to simplify and substantially reduce the number of steps to be performed to implement a surface-emission laser diode, while ensuring the best performance of the device thus obtained. The optical cavity, as well as the active region, may be made in a single hetero-epitaxy step, considerably simplifying the fabrication of a surface-emission laser. In addition, the method is particularly well suited to the fabrication of two-dimensional arrays of laser diodes, permitting new applications such as high-density and high-rate parallel optical links within future-generation supercomputers.

BRIEF DESCRIPTION OF THE DRAWINGS

Other features and advantages of the present invention will become apparent from the following detailed description of preferred embodiments given as a non-limitative example with reference to the accompanying drawings, in which:

FIGS. 3a and 3b show schematically and in sectional view a laser diode known from the prior art; FIG. 3b shows a detail of the active region of FIG. 3a;

The figures show non-limitative exemplary embodiments in which like reference numerals denote like elements in the various figures. Other implementations of the present invention can be readily devised by those skilled in the art.

DESCRIPTION OF THE PREFERRED EMBODIMENTS

Figure 1:
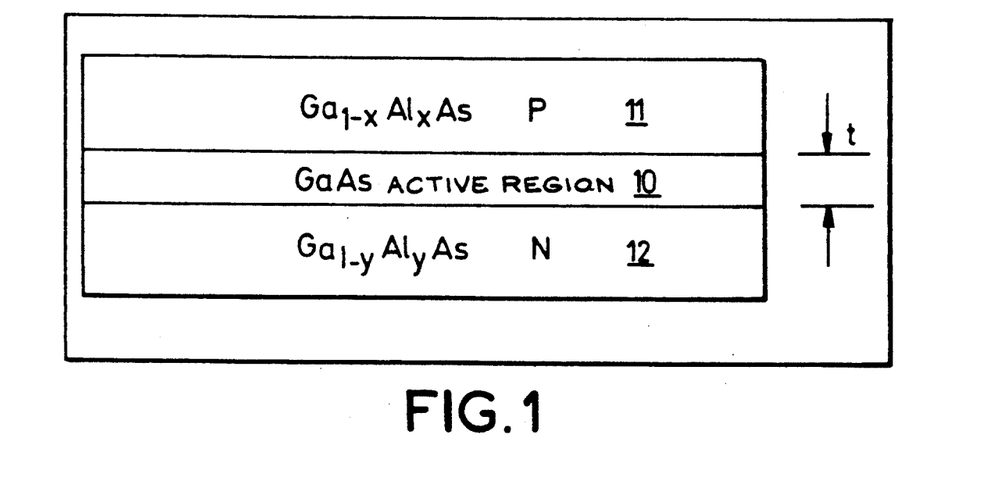
FIG. 1 shows schematically and in sectional view the electrical portion of a solid-state laser diode.

Referring to FIG. 1, it can be seen that the active region 10 of a laser diode is flanked by a p-type material 11 and a n-type material 12. The p-type 11 and n-type 12 materials respectively provide holes and electrons to the active region where they will be recombined while emitting light.

By way of example, the active region 10 may be made of GaAs, the p region 11 of $Ga_{1-x}Al_xAs$, and the n region 12 of $Ga_{1-y}Al_yAs$, where x and y are values between 0 and 1.

Figure 2:
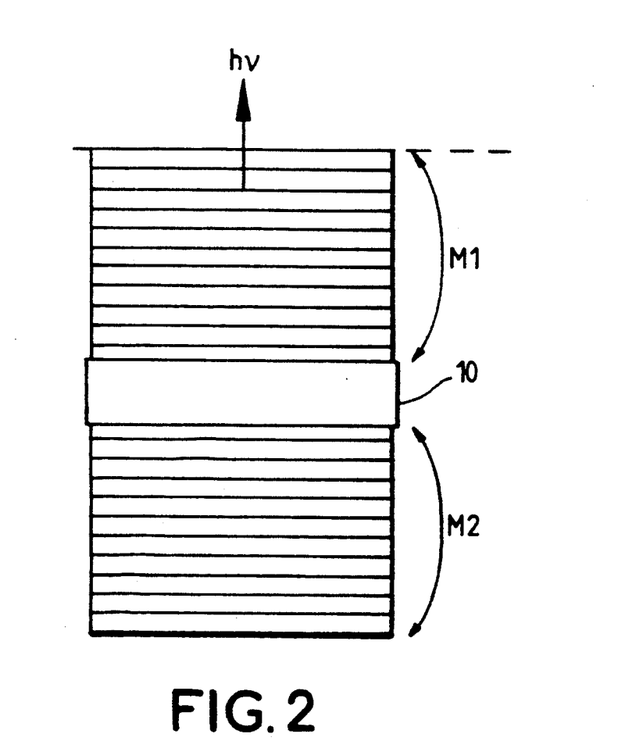
FIG. 2 shows schematically and in sectional view the optical portion of a surface-emission laser diode.

Referring to FIG. 2, it can be seen that the active region 10 of a surface-emission laser diode is placed in an optical cavity which consists of two mirrors M1 and M2, of which at least one M1 is partially transparent to let the laser light hv output along the axis of the active region and of the optical cavity, such as indicated in the Figure by the vertical arrow. In the example of FIG. 2, both mirrors M1 and M2 are made up of a stack of successive layers of materials with different indices of refraction. This can be achieved, for example, with GaAs layers alternated with GaAlAs layers, or alternatively with a stack of dielectric layers such as $SiO_2$ alternated with layers of $TiO_2$, for example. In a variant of the prior art, the mirrors M1 and M2 may be partially or fully implemented within the active region itself.

Figure 3A:
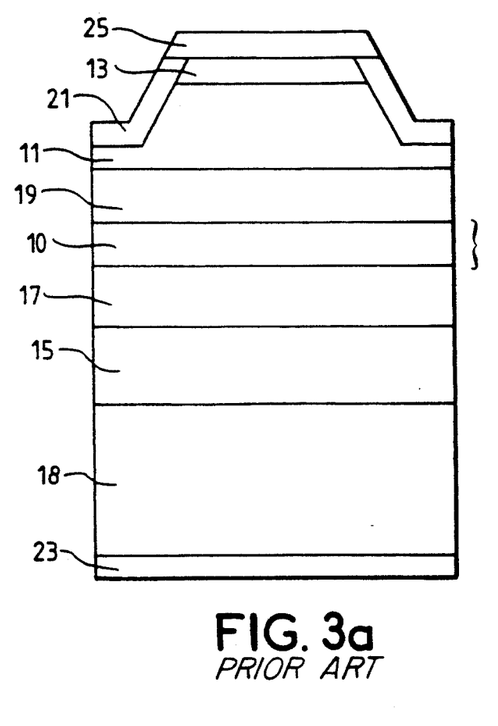
Figure 3B:
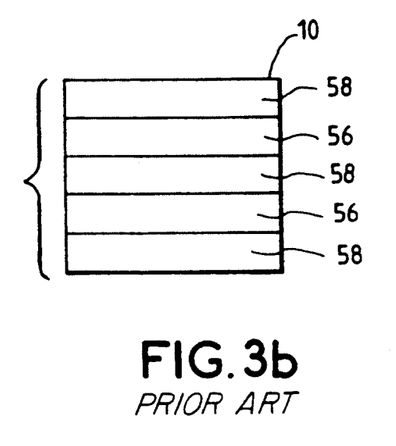

Referring to FIGS. 3a and 3b, an example of a laser diode known from the prior art is shown. FIG. 3a shows the implementation of successive epitaxial layers on the substrate 18, for example made of GaAs n-doped to a concentration of about $10^{18}/cm^3$. In the examples described with reference to the figures, there is mainly used GaAs and GaAlAs to form the successive layers of the active region, but other binary, ternary or quaternary compounds of the groups III-V, II-VI or IV-VI may be used indifferently to implement the present invention. A few examples of possible substitutions could be InP, GaInAsP, GaAsInP, . . . , PbSnTe.

In FIG. 3a, the first epitaxial layer 15 can be seen that will be, for example, made of GaAlAs and doped to a concentration of about $10^{18}/cm^3$ as the substrate. The second layer 17 is also made of GaAlAs in this example, but $n^-$-doped. Over this second layer 17, the active region 10 is formed thereafter. The structure of the active region is shown in detail in FIG. 3b.

On the active region 10, a third epitaxial layer 19 made of GaAlAs is deposited and $p^-$-doped. Then, a fourth epitatial layer 11 made of GaAlAs is formed and p-doped. Finally, a fifth epitaxial layer 13 made of GaAlAs is formed and $p^+$-doped.

The compositions of the layers flanking the active region are chosen so as to obtain a forbidden band width larger outside the active region 10 than within this region to provide the pumping energy to the laser by the carriers from the n-doped and p-doped regions. In the example of FIG. 3, the active region 10 is made up of alternate layers of GaAS 58 and GaAlAs 56 such as those shown in the detailed view of FIG. 3b. The thickness of the layers 56 and 58 is lower than 20 nm, which makes them "quantum wells".

A quantum well is formed by a region of smaller forbidden band width flanked by regions with a larger forbidden band width so as to confine free carriers in the region with smaller band width. In the quantum wells of very small dimensions, the density of states permitted to the carriers is lower than that in a solid material.

A photolithography step followed by a deep etching determine the transverse dimensions of the finished laser, typically about one micron in width. The Figure shows the laser in longitudinal sectional view along the propagation axis of the emitted light; the geometry of the laser may be axisymmetrical about this axis, or alternatively, the laser may have a square or rectangular geometry in a plane parallel to the substrate. The transverse dimensions must be as small as possible, for the lasing threshold current is proportional to the volume of the active region.

Metal ohmic contacts 21, 23 are formed on the ends of the laser to supply the electrical power to the regions providing the free carriers. The contact 23 deposited on the side of the substrate 18 opposite to the epitaxial layers, must also serve as a mirror in this example; it will preferably be made of Au, Ti, etc. The contact provided at the upper portion of the laser, on the tilted sides defined by photolithography, may be made of Au, Ti, Al, etc. Then a semitransparent mirror 25 is deposited on the last epitaxial layer 13. This mirror may be, for example, a dielectric multilayer whose alternate layers have different refractive indices, for example layers of $SiO_2$ alternating with layers of $TiO_2$.

FIG. 3 shows schematically an exemplary embodiment which is probably the simplest construction of the prior art. However, design trade-offs are inevitable in such an arrangement since the electric charge carriers and the photons of the laser light are forced to circulate in the same direction (parallel to the axis of the structure), the lateral confinement being substantially produced by the transverse dimension of the structure itself.

Figure 4:
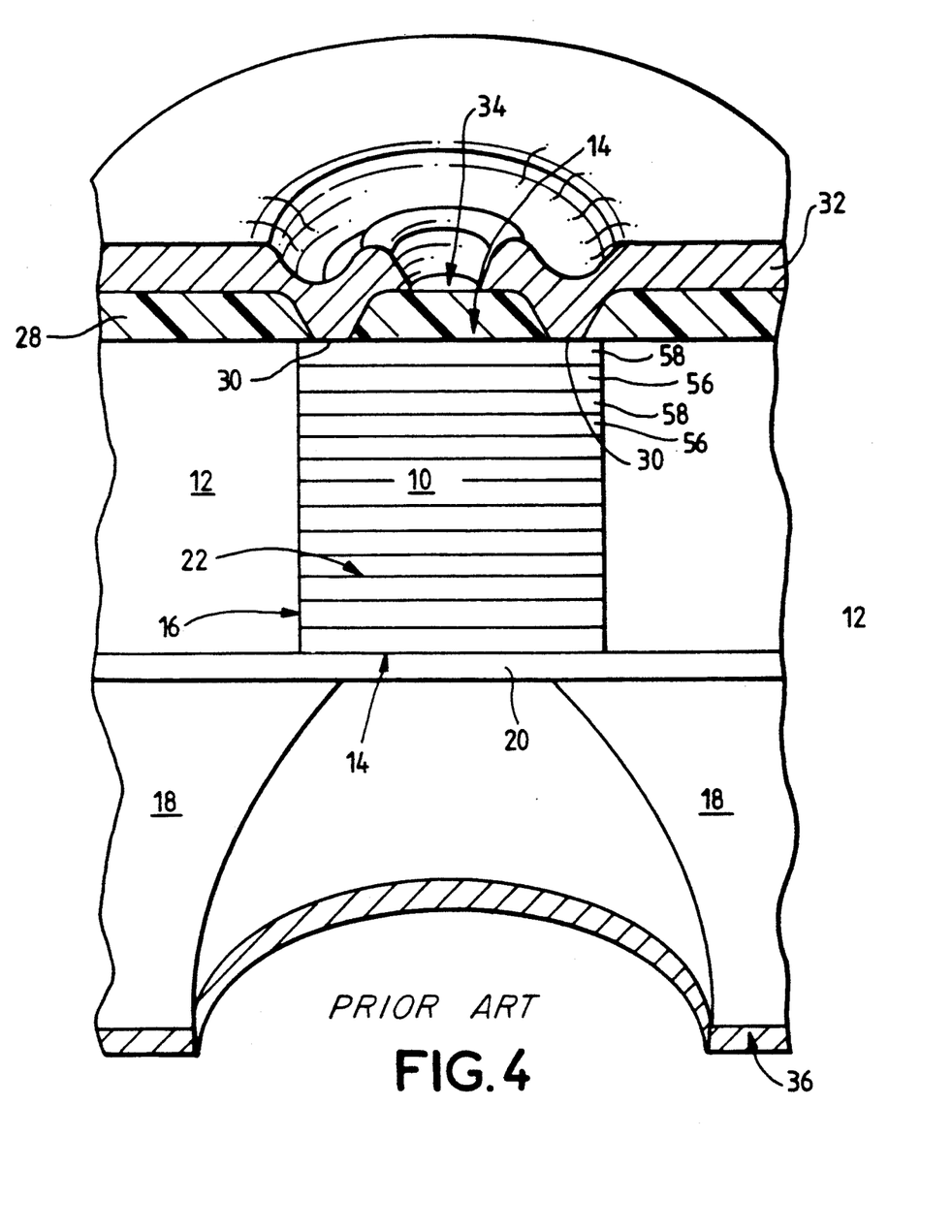
FIG. 4 shows schematically in sectional view and in perspective a surface-emission laser diode known from the prior art.

Referring to FIG. 4, there is schematically shown another exemplary embodiment known from the prior art in which the diode junction (n-doped and p-doped layers) is rather in the radial direction, perpendicular to the direction of propagation of the laser light. The active region is composed of a succession of alternate GaAs/GaAlAs layers as in the previous case, but this p-type region 10 is flanked laterally by an n-type material 12.

As in the case of FIG. 3, the substrate is adavantageously but not exclusively made of GaAs, in this case n+-doped to a level of about $2 \times 10^{18}/cm^3$. The layer 20, made of n-doped GaAlAs, has the function to stop the etching performed into the substrate after the fabrication of the laser in order to minimize the absorption of laser light by the substrate because the mirrors 14 are only partially reflective.

The method of implementation of the confinement region of material 12 uses an etching step to define the active region which is first formed with transverse dimensions larger than the final dimensions, by stacking alternate successive layers of GaAs 58, GaAlAs 56, doped with p-type impurities to a level of $2 \times 10^{17}/cm^3$. Selective etching of these layers leaves a column with a diameter of about 5 microns. Then the confinement region, made of GaAlAs n-doped to $2 \times 10^{17}/cm^3$, is deposited around the active region to a depth substantially equal to the height of the column.

The insulating layer 28, made of $SiO_2$, is then deposited and an annular window 30 is etched down to the upper surface of the active region 10. After diffusion of zinc through this annular window toward the upper surface of the column, an electrical contact 32 made of Pt-Au-Ti is deposited through a mask, and another electrical contact layer 36, made of Au-Ge, is deposited on the lower surface of the substrate 18.

The example in FIG. 4 is that of a structure that most resembles the structure achievable through the method of the invention, but we will see how much the method of the invention simplifies and reduces the required number of processing steps.

Figure 5:
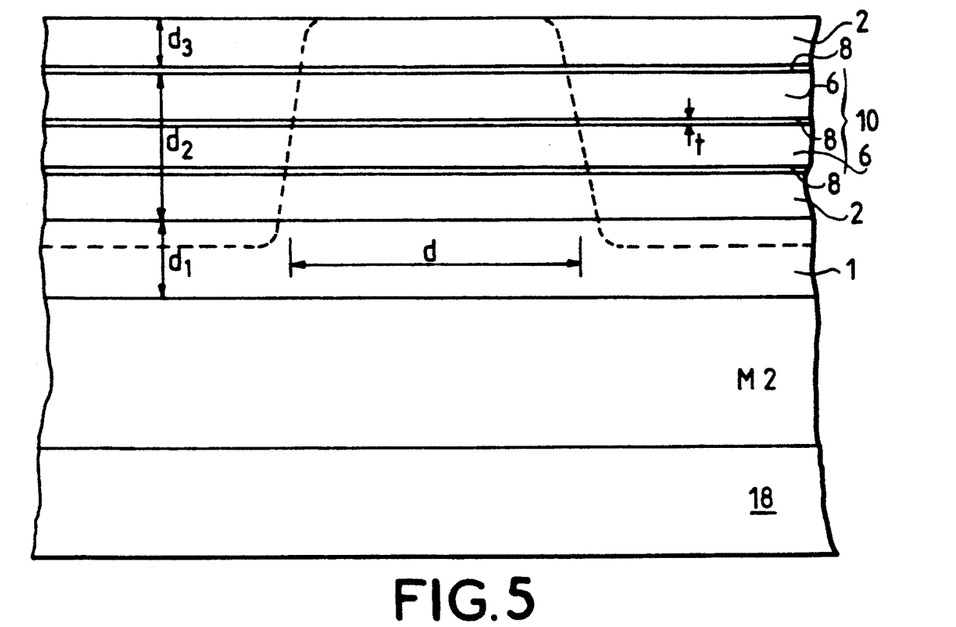
FIG. 5 shows schematically and in longitudinal sectional view the first steps of the implementation of an exemplary embodiment of a surface-emission laser diode according to the invention.

Referring to FIG. 5, there are shown schematically and in sectional view the first steps of the implementation of an exemplary embodiment of a surface-emission laser diode according to the present invention. The laser may have an axisymmetrical symmetry, being then circular in the plane of the epitaxial layers, or may have a rectangular shape in this plane.

A single-crystal Bragg mirror M2 is composed of alternate layers of different compounds obtained by epitaxial single-crystal growth in accordance with the methods known by those skilled in the art on a single-crystal substrate 18. By way of example, in a preferred embodiment, the substrate 18 may be made of GaAs, and the Bragg mirror may be made up of alternate layers of GaAs and GaAlAs. Of course, other combinations of different compounds can be chosen among the elements of the groups III-V, II-VI and IV-VI. The layers of the mirror M2 and the substrate 18 will be n-doped, for example, in accordance with methods known by those skilled in the art, to make it possible to move electrons toward the active region in the finished device.

Then, a first epitaxial layer 1 made of a first compound with a thickness $d_1$ and a forbidden band $E_2$ is deposited on the mirror M2. The compositions of the layer 1 and of the last upper layer of the mirror M2 are chosen so as to allow lattice coherence in their interface to minimize the occurence of defects which would have a detrimental effect on the performance of the finished device. The layer 1, as well as the layers that will follow, has transverse dimensions larger than those of the active region (the transverse dimensions of the active region, whose extent d is indicated in FIGS. 5 through 8 by dashed lines, are those in the plane of the layers, perpendicular to the direction of propagation of the light emitted by the surface of the laser).

In a preferred embodiment, a second epitaxial layer 2, made of a compound having a forbidden band $E_2 > E_1$, is formed, again through single-crystal growth with lattice coherence and substantially without interface defects.

On the layer 2, the active region proper 10 is then formed, again by single-crystal growth and with lattice coherence. The active layer 10, in the case of the present embodiment, is made up of a plurality of quantum wells 8, which consists in stacking several (N) thin (thickness t of about a few nanometers, for example) active layers separated by intermediate layers 6 of about 100–120 nm thickness, for example. These active 8 and intermediate 6 alternate layers, with different compositions, have transverse dimensions larger than those d of the active region of the finished device.

The thickness t of the active layers 8 is minimized in order to minimize the threshold current that should be injected to obtain laser action, this current being proportional to the volume of the active region. In a preferred embodiment, the thickness of the intermediate layers, as well as the dimensions $d_1$ and $d_3$, are chosen so as to correspond to the wavelength of the laser light confined as a standing wave within the active region by the mirrors; the active layers 8 are placed at the locations where the field strength of the standing wave is maximum, the nodes of the wave being located between the active layers 8. This arrangement allows achievement of the maximum of light amplification by stimulation of radiation in the active layers.

In another preferred embodiment, the intermediate layers 6 are made as superlattices. In a superlattice, the lattice mesh of the alternate thin layers, even made of different compounds, has a single value and consequently will not produce interface defects.

The forbidden band of a superlattice will be approximately the average of the forbidden bands of the compounds forming the alternate thin layers.

The composition of the active layers 8 and intermediate layers 6 is chosen so as to obtain the desired wavelength of the laser light, for example GaInAs and GaInAsP to obtain a radiation at 1.3 microns. In another preferred embodiment, a stack of alternate GaAs layers and GaAlAs layers is used.

After having deposited the last quantum well of the active region, a last layer 2 with a composition identical to that of the preceding layer 2, may be deposited on the last active layer 8 of the active region; this layer will be formed by the same methods of single-crystal growth.

It is possible to give examples of the dimensions indicated in FIG. 5 to give the orders of magnitude as a non-limitative example: in the case of GaAs and a wavelength of 850 nm, and knowing that the index of refraction in GaAs is $n=3.5$, the thickness $d_1$ of the layer 1 is of the same order of magnitude as the thickness $d_3$ of the layer 2, i.e., approximately 120 nm. The thickness $d_2$ of the active region is approximately $N \times 120$ nm, where N is an integer and is the number of quantum wells ($N<10$). The width or the diameter d of the active region is of about 1 to a few microns. In the case of InP, with a refractive index $n=3.3$ and a wavelength of 1300 or 1500 nm, the dimensions $d_1$ and $d_3$ are of about 200 nm and $d_2$ is of about $N \times 200$ nm.

In a further preferred embodiment (not shown) of the present invention, several (M) active layers may be grouped about each field maximum to increase the amplification of the device, but by thus increasing the total active volume ($N \times M \times d^2 \times t$), the threshold current is also and correspondingly increased. For this reason, the number of quantum wells $N \times M$ is kept to a minimum, taking into account the losses in the device.

Figure 6:
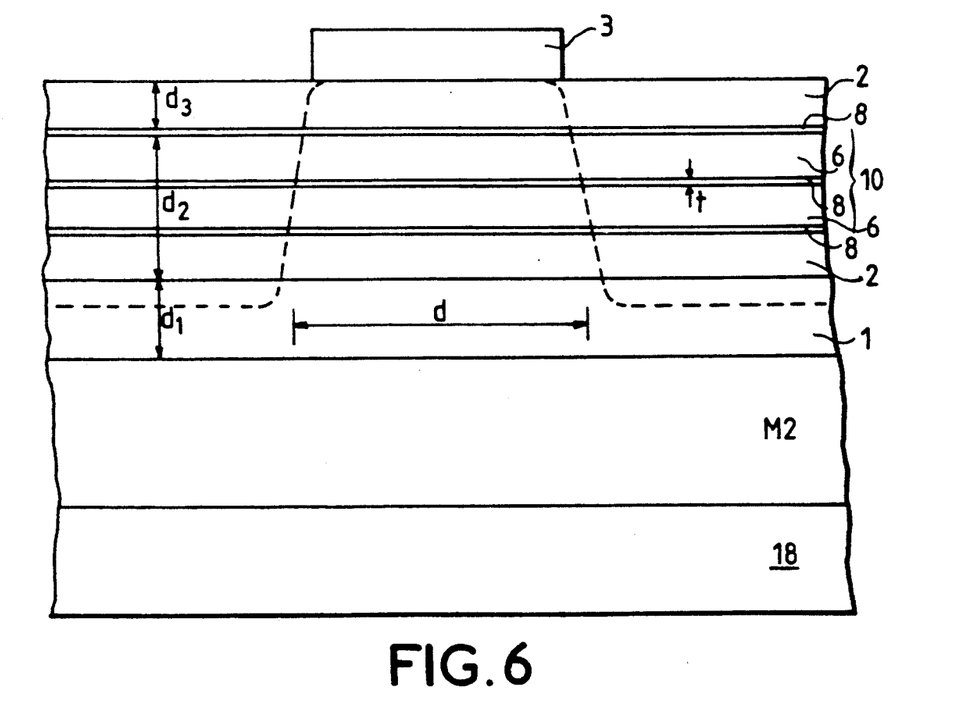
FIG. 6 shows schematically and in longitudinal sectional view another step of the implementation of an exemplary embodiment of a surface-emission laser diode according to the invention.

Referring to FIG. 6, there is shown a next processing step which consists in putting a protective mask 3 to protect the active region on the exposed surface thereof. This mask is made of $Si_3N_4$, for example, or of $Al_2O_3$, or another compound transparent at the emission wavelength of the laser and will have the transverse dimensions d of the final active region. In the preferred embodiment shown in FIGS. 6 through 8, this transparent mask will remain in the finished device. However, in another embodiment, a temporary mask may be implemented, for example made of metal, dielectric or resin. This temporary mask may then be removed, after the step of impurities diffusion around the active region, leaving the last epitaxial layer on which the semitransparent mirror M1 would then be deposited.

Figure 7:
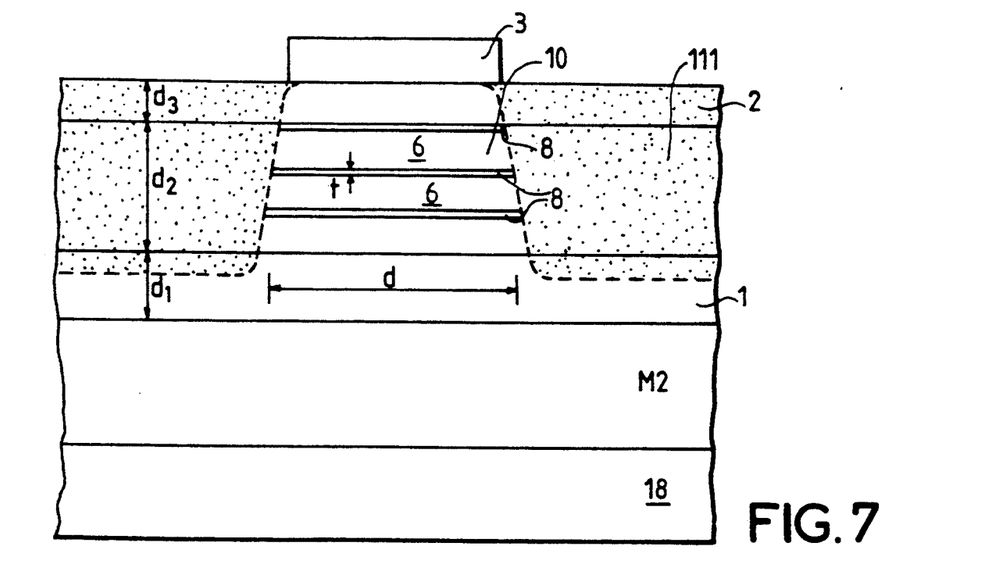
FIG. 7 shows schematically and in longitudinal sectional view a further step of the implementation of an exemplary embodiment of a surface-emission laser diode according to the invention.

Referring to FIG. 7, a next processing step is shown which consists in introducing a doping impurity of the p type through the surface of the device around the active region. The mask 3 is capable of protecting the active region from the diffusion of this doping impurity which can be, for example, Zn or Cd. The diffusion of this doping impurity has also a secondary and significant effect, for the presence of this impurity allows the interdiffusion or migration among the various epitaxial layers, provided they are sufficiently thin, which results in an homogenization of the composition of the region thus diffused. This effect is referred to as impurity induced diffusion (IID). In an example of composition indicated above, the aluminum in the intermediate layers of GaAlAs will be made mobile and will diffuse in the active GaAs layers, thus erasing the structure of the stacked layers in the doped region around the active region. This is indicated in the drawing of the region 111 outside the dashed lines by small points representing impurities (at a concentration of about $10^{18}/cm^3$).

In an equivalent variant of the method of the invention, the substrate 18 and the mirror M2 are p-doped, and the region around the active region is n-doped.

The active layers are made of a compound having a forbidden band width $E_0 < E_1 \leq E_2$. The diffusion of the doping impurity in the region outside and around the active region causes the interdiffusion of the compounds of the different layers having forbidden bands $E_0$ and $E_1$ prior to interdiffusion. The value of the energy of the forbidden band of the compound resulting from the interdiffusion is the average $E_m$ of those of the two initial forbidden bands $E_1$ and $E_0$ weithed by their relative concentrations in the resulting homogeneous compound. As a result, the energy of the forbidden band $E_0$ of the active layers in the active region is lower than $E_m$, and thus the charge carriers will be confined in the active region until their radiative recombination. In addition, the interdiffusion results in a change in the index of refraction, which assists in confining the photons locally in the active region (index of refraction higher in the active region than in the diffused region).

Figure 8:
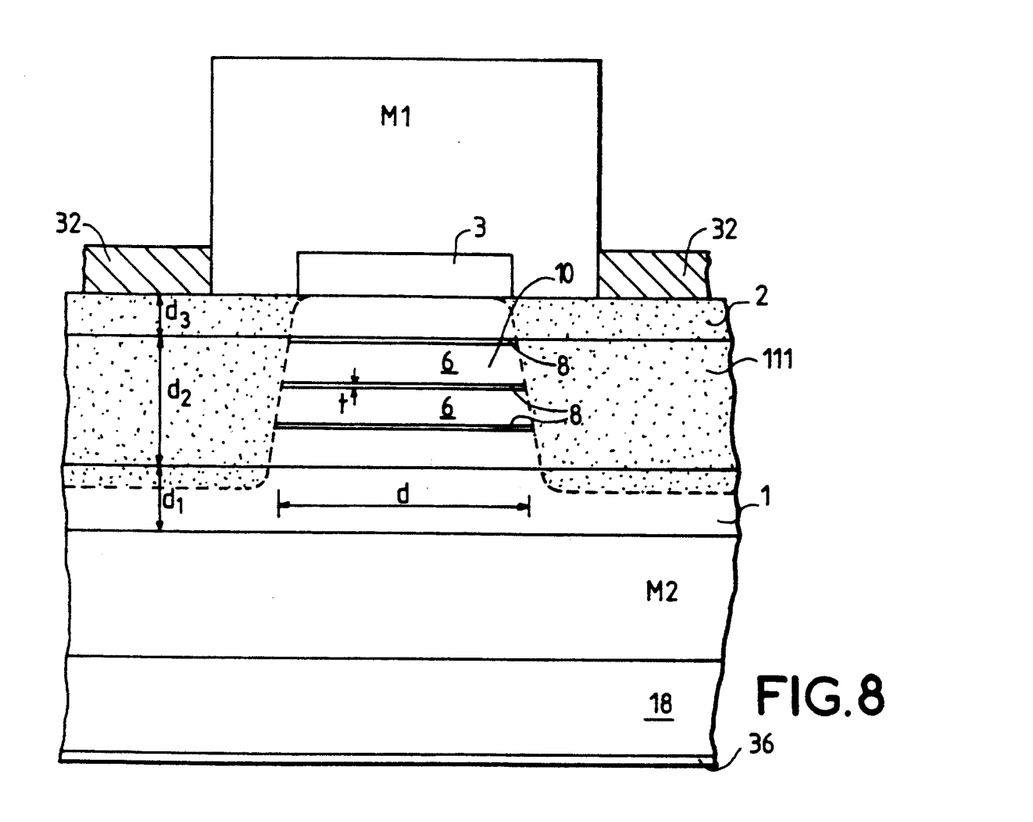
FIG. 8 shows schematically and in longitudinal sectional view an exemplary embodiment of a surface-emission laser diode implemented according to the method of the invention.

FIG. 8 shows schematically the last steps of the fabrication of, for example, a surface-emission laser according to the present invention, as well as the final resulting device. First, the metal ohmic contacts 32 and 36 are deposited on the upper and lower surfaces of the laser, the extent of the contacts being defined either previously by masking or afterwards by etching.

Then the semitransparent mirror M1 is constructed, for example with dielectric multilayers. In a preferred embodiment, this mirror is fabricated by stacking layers of $SiO_2$ and of $TiO_2$. This mirror allows both to confine the photons in the optical cavity and to tap the laser light toward the outside to use it.

In the method according to the invention, there is only a single step of hetero-epitaxy with single-crystal growth: that for the distributed Bragg mirror and the passive and active regions. The interdiffusion of the active and intermediate layers outside and around the active region, caused by the addition of the doping impurity, has three functions: to establish a p-type region capable of providing holes, to laterally confine the free charge carriers and the photons in the active region, and to avoid the non-radiative recombination on the edges of the active region. The laser can thus be fabricated in great numbers on a single substrate, with a number of steps substantially reduced with respect to the prior art, and with better performance.

Moreover, the method according to the present invention can easily be adapted, by adding a single step, to the fabrication of arrays of laser diodes in which the lasers can be individually controlled. To this end, the lasers are separated by a deep anisotropic etching in accordance with the methods known to those skilled in the art: chemical etching, laser ablation, ionic erosion, etc. The etching will go through the layer 2 and the homogeneous 111 p region to stop in the layer 1 or the mirror M2. In a next step, the ohmic contacts 32 are deposited by screen printing, photolitography or any other suitable method applicable by those skilled in the art, in accordance with a configuration of conductive traces that permits to address the various lasers in the array.

What is claimed is:

1. A method for implementing a surface-emission laser whose light emission occurs along a direction z perpendicular to the surface of said laser, comprising the steps of:
    epitaxially growing on a single-crystal substrate a single-crystal Bragg mirror made up of alternate layers of different compounds, said substrate and said mirror being doped with a first impurity capable of creating in the doped region free charge carriers of a first type;

epitaxially growing at least one single-crystal layer of a first compound with a forbidden band $E_2$;

epitaxially growing single-crystal multiple layers forming an active medium forming a plurality of quantum wells delimited and separated by intermediate layers of a compound with a forbidden band $E_1$, said quantum wells being thin layers of another compound with a forbidden band $E_0 < E_1 \leq E_2$, said multilayer active medium having transverse dimensions perpendicular to said direction z larger than those of said active region of the laser to be obtained;

epitaxially growing a last single-crystal layer of a compound having a forbidden band $E_1 \leq E_2$;

masking a portion of the surface of said last layer of the active region to define said transverse dimensions of said active region;

implanting and diffusing a second impurity in the region surrounding said active region previously masked to a depth reaching said first epitaxial layer with a forbidden band $E_2$, said second impurity being capable of creating in said region surrounding the masked active region free charge carriers of a second type different from said first type;

depositing metal ohmic contacts on said last epitaxial layer with a forbidden band $E_1$ in electrical contact therewith under said substrate and in contact therewith; and depositing a semitransparent mirror on said active region.

2. Method of implementation of a surface-emission laser according to claim 1, wherein said first impurity is of the n type and is silicon.

3. A method of implementation of a surface-emission laser, according to claim 1 or 2, wherein said second impurity is of the p type and is zinc or cadmium.

4. A method of implementation of a surface-emission laser according to claim 1, wherein said different alternate layers of said Bragg mirror are composed of the same chemical elements in different proportions.

5. A method of implementation of a surface-emission laser according to claim 1, wherein said quantum wells and said intermediate layers have substantially different dimensions in said direction z.

6. A method of implementation of a surface-emission laser according to claim 1, wherein said intermediate layers are comprised of thin films stacked to form superlattices.

7. A method of implementation of a surface-emission laser according to claim 1, wherein said masking is effected by a transparent layer of dielectric.

8. A method of implementation of a surface-emission laser according to claim 7, wherein said transparent layer of dielectric is made of $Si_3N_4$ or $Al_2O_3$.

9. A method of implementation of a surface-emission laser according to claim 1, wherein said diffusion of a second impurity into said region surrounding the active region is obtained by heating.

10. A method of implementation of a surface-emission laser according to claim 9, wherein said heating is obtained by means of an electromagnetic radiation.

11. A method of implementation of a surface-emission laser according to claim 1, wherein said semitransparent mirror is a dielectric mirror formed by a stack or alternate layers of different compositions.

12. A surface-emission semiconductor laser implemented according to claim 1.

13. An array of a plurality of surface-emission semiconductor lasers according to claim 12, wherein said lasers are implemented on a single substrate.

14. An array of surface-emission semiconductor lasers according to claim 13, wherein said lasers are isolated from one another by a deep anisotropic etching.

15. An array of surface-emission semiconductor lasers according to claim 14, wherein said isolated lasers include ohmic contacts, said ohmic contacts being in electrical contact with electrical traces whose configuration permitting individual addressing of each laser in said array.

* * * * *